(12) United States Patent
Madge et al.

(10) Patent No.: US 6,782,500 B1
(45) Date of Patent: Aug. 24, 2004

(54) STATISTICAL DECISION SYSTEM

(75) Inventors: Robert J. Madge, Portland, OR (US); Emery Sugasawara, Pleasanton, CA (US); W. Robert Daasch, West Linn, OR (US); James N. McNames, Portland, OR (US); Daniel R. Bockelman, Portland, OR (US); Kevin Cota, Portland, OR (US)

(73) Assignee: LSI Logic Corporation, Milpitas, CA (US)

(*) Notice: Subject to any disclaimer, the term of this patent is extended or adjusted under 35 U.S.C. 154(b) by 625 days.

(21) Appl. No.: 09/639,440

(22) Filed: Aug. 15, 2000

(51) Int. Cl.⁷ ................. G01R 31/3183; G01R 31/517; G01R 31/28
(52) U.S. Cl. .................. 714/738; 324/763; 702/118
(58) Field of Search ................. 714/724, 734, 714/738; 324/763; 702/118

(56) References Cited

U.S. PATENT DOCUMENTS

| | | | | |
|---|---|---|---|---|
| 4,817,093 A | * | 3/1989 | Jacobs et al. ............... | 714/728 |
| 5,457,400 A | * | 10/1995 | Ahmad et al. .............. | 324/763 |
| 5,889,408 A | | 3/1999 | Miller ......................... | 324/765 |
| 6,208,947 B1 | * | 3/2001 | Beffa ........................... | 702/118 |
| 6,233,184 B1 | * | 5/2001 | Barth et al. .................. | 365/201 |
| 6,265,232 B1 | * | 7/2001 | Simmons ..................... | 438/14 |
| 6,446,021 B1 | * | 9/2002 | Schaeffer .................... | 702/118 |

OTHER PUBLICATIONS

"Testing and Debugging Custom Integrated Circuits" by Frank et al. Published by ACM Computing Surveys, vol. 13, No. 4, Dec. 1981 pp. 425–451.*

*An Histogram Based Procedure for Current Testing of Active Defects*, Thibeault, ITC International Test Conference, 1999.
*Clustering Based Techniques for $I_{DDQ}$ Testing*, Jandhyala et al., ITC International Test Conference, 1999.
*Current Rations: A Self–Scaling Technique for Production $I_{DDQ}$ Testing*, Maxwell et al., ITC International Test Conference 1999.
$I_{DDQ}$ *Defect Detection in Deep Submicron CMOS IC's*, Kundu.
*A Comprehensive Wafer Oriented Test Evaluation Scheme for the $I_{DDQ}$ Testing of Deep Sub–Micron Technologies*, Singh.
*On the Comparison of Delta $I_{DDQ}$ and $I_{DDQ}$ Testing*, Thibeault.

* cited by examiner

*Primary Examiner*—Albert Decady
*Assistant Examiner*—Cynthia Britt
(74) *Attorney, Agent, or Firm*—Luedeka, Neely & Graham, PC

(57) ABSTRACT

A method for testing integrated circuits, where a predetermined set of input vectors is introduced as test input into the integrated circuits. The output from the integrated circuits in response to the predetermined set of input vectors is sensed, and the output from the integrated circuits is recorded in a wafer map, referenced by position designations. The recorded output for the integrated circuits is mathematically manipulated, and the recorded output for each of the integrated circuits is individually compared to the mathematically manipulated recorded output for the integrated circuits. Graded integrated circuits that have output that differs from the mathematically manipulated recorded output for the integrated circuits by more than a given amount are identified, and a classification is recorded in the wafer map for the graded integrated circuits, referenced by the position designations for the graded integrated circuits.

20 Claims, 3 Drawing Sheets

STATISTICAL DECISION SYSTEM

FIELD

This invention relates to the field of testing integrated circuits. More particularly the invention relates to a system for applying the failure limits for various electronic characteristics of an electronic circuit at a point in time after the electronic characteristics of the integrated circuits have been sensed.

BACKGROUND

Integrated circuit fabrication is an extremely complex process. Therefore, the various processes used to fabricate integrated circuits are often categorized in some manner, in order to simplify the description of the various phases of fabrication. For example, the various steps employed to create the integrated circuits while they are disposed upon a monolithic substrate is often called wafer processing. After wafer processing, the devices are tested for conformance to predicted parameters in what may be called wafer testing. After wafer testing the circuits are diced and then integrated circuits that have been binned as "good" circuits are packaged.

Typically, an individual integrated circuit on the wafer is binned as good or bad during wafer testing. The wafer testing equipment is programmed to run a regimen of tests on each integrated circuit by applying known electrical input on the electrical contact pads of the integrated circuit. The electrical response of the integrated circuit to the input is sensed and measured at the output electrical contact pads of the integrated circuit. The measured output values are compared to a set of predetermined expected output values, and if any of the measured output values violate the corresponding predetermined expected output values, such as by being either greater than or less than the predetermined expected output value as the case may be, then the integrated circuit is binned by the automated wafer tester as bad.

When the circuit is designated as bad, a drop of ink is typically placed atop the circuit by the wafer tester. After the integrated circuits are diced, the pick and place unit that removes the individual integrated circuits and places them into packages detects the ink drop on the bad integrated circuits, and skips them so that they are not placed into packages and processed further. The inked integrated circuits that are left on the dicing tape by the pick and place are then discarded.

The predetermined expected output values are typically determined by correlating output values for a large number of packaged devices. The packaged devices are tested to see whether they function properly or whether they fail prematurely. The output values for those devices that either do not function at all or fail prematurely are studied, and a predetermined expected output value is selected such that most of the devices with output values that do not violate the predetermined expected output value function properly for a desired length of time, and most of the devices with output values that do violate the predetermined expected output value either do not function properly for the desired length of time or do not function properly.

Unfortunately, this method of setting expected output values is extremely imprecise. Some of the devices that violate the predetermined expected output value function properly for the desired length of time, and some of the devices that do not violate the predetermined expected output value do not function properly for the desired length of time.

Thus, this traditional method of wafer testing and binning is extremely inflexible and does not account for the individual characteristics of an integrated circuit on the wafer. For example, the automated wafer tester has no way of knowing whether the output value received from the tested integrated circuit is a value that should be expected from the integrated circuit, based on the specific processing received by that integrated circuit. Thus, some amount of integrated circuits that are actually good are binned as bad, and some amount of integrated circuits that are actually bad are binned as good. Further, once the automated wafer tester bins a specific integrated circuit as bad and places an ink drop on it, there is no easy way to go back to and review the test data and reclaim the integrated circuit.

What is needed, therefore, is a system to bin integrated circuits in response to binning limits that are based upon expected output values that take into account specific processing received by the integrated circuits, rather than upon predetermined expected output values that do not take into account specific processing. Further, a system is needed that provides flexibility in binning the integrated circuits in response to the binning limits.

SUMMARY

The above and other needs are met by a method for processing integrated circuits, where a predetermined set of input vectors is introduced as test input into the integrated circuits. The output from the integrated circuits in response to the predetermined set of input vectors is sensed, and the output from the integrated circuits is recorded in a wafer map, referenced by position designations. The recorded output for the integrated circuits is mathematically manipulated, and the recorded output for each of the integrated circuits is individually compared to the mathematically manipulated recorded output for the integrated circuits. Graded integrated circuits that have output that differs from the mathematically manipulated recorded output for the integrated circuits by more than a given amount are identified, and a failure classification is recorded in the wafer map for the graded integrated circuits, referenced by the position designations for the graded integrated circuits.

In this manner, the processing of the integrated circuits is taken into account. This is accomplished by using a difference between the mathematically manipulated value and the sensed value for each individual integrated circuit for the determination as to whether the individual integrated circuit is binned as a passing or failing device, rather than binning the integrated circuit based on whether it violates a predetermined expected value. In a preferred embodiment of the method described above, all of the values for the integrated circuits on a wafer are sensed and output prior to using them in the mathematical manipulations. It is also preferable that the steps of the method up to and including the step of recording the output from the integrated circuits are accomplished by a wafer tester, and the subsequent steps of the method are accomplished by an off-line binner. In this manner, a great degree of flexibility is provided by the method.

Aspects of the invention are also embodied in an instruction set residing on a digital recording media. The instruction set enables a computing device to receive and analyze an ordered data set that contains individual data points from a wafer tester, where the individual data points relate to electrical characteristics of integrated circuits. The instruction set also enables the computing device to associate failure codes with selected ones of the integrated circuits. The instruction set includes input instructions for receiving the ordered set of data from the wafer tester. Computational instructions mathematically manipulate the ordered set of data to produce a reference value, and comparison instructions compare the individual data points to the reference value to identify individual data points that differ from the reference value by more than a given amount. Binning instructions associate the failure codes with the integrated circuits that have individual data points that differ from the reference value by more than the given amount, and output instructions output the failure codes with the ordered data set.

In a preferred embodiment, the reference value is the median of the ordered set of data, and the standard deviation of the ordered set of data is used as the basis for determining the given amount by which the integrated circuits are binned.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
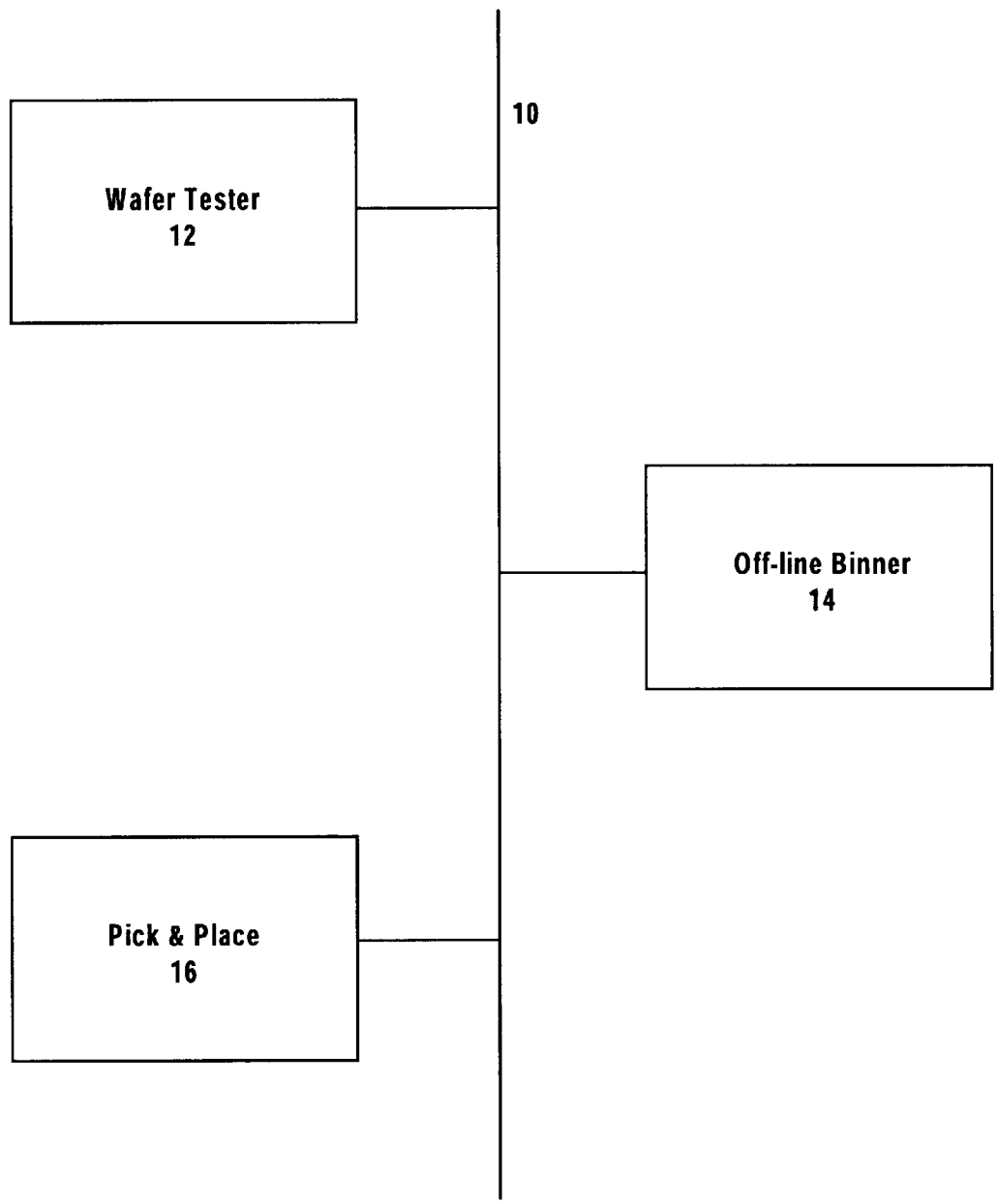
FIG. 1 is a functional block diagram of an off-line binning system.

Turning now to the drawings, there is depicted in FIG. 1 a functional block diagram of a system according to the present invention. Block 12 represents a wafer tester, such as those commonly used in the industry, where the various electrical characteristics of an integrated circuit are tested, preferably while the integrated circuit is still in wafer form. Network 10 represents communication between the wafer tester 12 and the other components of the system, as described below. The network 10 may be a computerized electronic network with associated mass storage, or it may be discrete data storage, such as a floppy disk.

In a most preferred embodiment, the electrical characteristics of the integrated circuits are sensed by the wafer tester 12, but the integrated circuits are not binned as to passing or failing. However, in alternate embodiments, the wafer tester 12 is programmed with pass and fail limits, as is standard in the industry, and outputs files to the network 10 that include bin data. It is preferred, however, that the wafer tester 12 not ink any of the integrated circuits that it bins as failures. In this manner, the integrated circuits that are binned as failures by the wafer tester 12 are more easily recovered if they are subsequently rebinned as passing devices at a later stage in the system.

Preferably, the data that is output by the wafer tester 12 is referenced in some manner to the position on the wafer of the integrated circuit from which it was sensed. In a most preferred embodiment this is accomplished by writing the data records to the network 10 with row and column references to the integrated circuits, as they are laid out on the wafer in a standard orientation, as determined by wafer flats or other persistent geographical features of the wafer.

The data relating to the electrical characteristics of the integrated circuits is read in to an off-line binner 14. The off-line binner 14 can receive the data in a variety of ways, primarily dependant upon the form of output used by the specific wafer tester 12 in use. For example, if the wafer tester 12 outputs the data to a mass storage device located on the network 10, then the off-line binner 14 can read the data from the mass storage device via a similar network connection. Alternately, if the wafer tester 12 produces the output on a floppy disk, then the off-line binner 14 is preferably provided with and reads the floppy disk created by the wafer tester 12.

The off-line binner 14 mathematically manipulates the data received from the wafer tester 12 to determine new pass and fail criteria for the integrated circuits, preferably based on the data received for a single wafer tested by the wafer tester. This is preferably accomplished by determining a reference value, against which the data points for the integrated circuits within the data set are compared. In a most preferred embodiment, the reference value is determined by computing an average for the data set. The average that is used is most preferably a median average, although in alternate embodiments a mean or mode average could be used. In further embodiments, a predetermined value, such as one determined through historical compilation of empirical data, could also be used.

By using an average of the current data set as the reference value against which the integrated circuits are compared, the present method takes into account the specific processing that has been applied to the wafer being tested. For example, the wafer under test may have electrical characteristics that are somewhat different than normal, because of the specific processing received, but which are not deleterious to the proper functioning of the integrated circuits on the wafer, again because of the slight differences in the specific processing received by the wafer.

The individual data points for the integrated circuits represented in the data set are compared to the reference value that has been determined as described above. This comparison may take one or more of several different forms. In a most preferred embodiment, the arithmetic difference between the reference value and each individual data point is determined. This difference then represents an offset between the reference value and the data point. The offset associated with each integrated circuit is then evaluated to determine whether it is greater than a given amount. If the offset is greater than the given amount, then the integrated circuit is binned as failing, and if the offset is less than the given amount, then the integrated circuit is binned as passing, as described with more detail below.

The given amount against which the offset associated each integrated circuit is compared may be determined according to one or more of a variety of different methods. For example, in a preferred embodiment the given amount is statistically determined from the data points within the data set. This may be accomplished in a manner such as determining a variance within the data set, such as by determining the standard deviation of the data set, and using the standard deviation, or some other indication of variance, as the basis for the given amount. For example, the given amount may be set as equal to a three sigma value for the data set. In this example, those offsets that have an absolute value greater than the three sigma value are considered to be outliers with abnormal data parameters, and are assigned failing binning codes by the off-line binner 14, and those offsets that have an absolute value that is less than the three sigma value are considered to have "normal" data parameters, and are assigned passing binning codes by the off-line binner 14. In yet an additional alternate embodiment, the given amount is based on a predetermined value, such as may be determined by historical empirical data.

In other embodiments, the given amount by which the outliers are determined may have a different value in different circumstances. For example, a first given amount may be used to evaluate those offsets that represent a data point that is greater than the reference value, and a second given amount may be used to evaluate those offsets that represent a data point that is less than the reference value. This embodiment may be preferred for those electrical characteristics that can tolerate a certain degree of variation above the reference value, and a different degree of variation below the reference value.

Further, a different value for the given amount may be used when changing the binning classification of an integrated circuit that has previously been binned, such as by a wafer tester 12. In this embodiment, a first given amount may be used to evaluate and possible reclassify a previously failing integrated circuit as a passing integrated circuit, and a second given amount may be used to evaluate and reclassify a previously passing integrated circuit as a failing integrated circuit. In this manner, the limits for rebinning the integrated circuits can be more narrowly tailored to favor either ensuring that as few as possible good devices are discarded as failures, or ensuring that as few as possible bad devices are passed as acceptable.

After the integrated circuits have been associated with binning data by the off-line binner 14, as described above, the data is again passed on the communication means 10 to a pick and place unit 16, which uses the binning data to remove the good integrated circuits from the dicing tape and stage them for packaging. Preferably, the integrated circuits that have been designated as failures by the off-line binner 14 remain on the dicing tape and are eventually discarded. By using the wafer map created by the off-line binner 14 as the indicator for which integrated circuits are good and which integrated circuits are bad, the pick and place unit 16 does not require the individual integrated circuits to be physically marked in any way, such as by an ink drop, in order to make the determination. This provides for a degree of freedom in reassigning the pass or fail classification of the integrated circuits during the analysis performed in the off-line binner 14.

Figure 2:
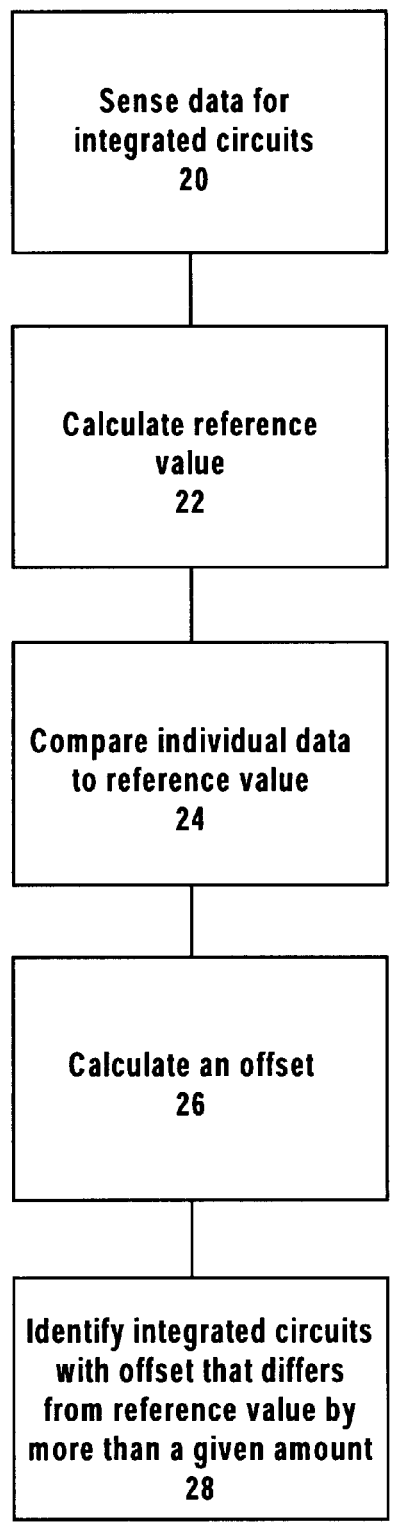
FIG. 2 is a flow chart of a method for binning integrated circuits as passing or failing.

FIG. 2 depicts a flow chart of a method according to the system, where the data for the integrated circuits is sensed in step 20, such as by a wafer tester 12. The reference value is calculated in step 22, as described in more detail above, such as by an off-line binner 14. The individual data is compared to the reference value in step 24, and the offset of the individual data from the reference value is calculated in step 26. In step 28, the offset is compared to a given amount, to determine the outlier integrated circuits, again as has been explained in more detail above.

Although this description generally describes the process and apparatus for determining passing integrated circuits and failing integrated circuits, it is appreciated that the invention is equally applicable to assigning differing passing codes to passing integrated circuits or differing failure codes to failing integrated circuits. For example, the method and apparatus described herein can not only assign failure codes as described, but can also assign a grade of passing code, where the grade of the passing code assigned relates to the magnitude of the offset between the value of the sensed parameter for the integrated circuit and the reference value. For example, integrated circuits with relatively smaller offsets may be assigned a passing code indicating a higher passing grade, where integrated circuits with relatively larger offsets, but not so large as to be classified as an outlier, may be assigned a passing code indicating a lower passing grade. This may be useful, for example, in applications where differing speeds of integrated circuits are desired.

Figure 3:
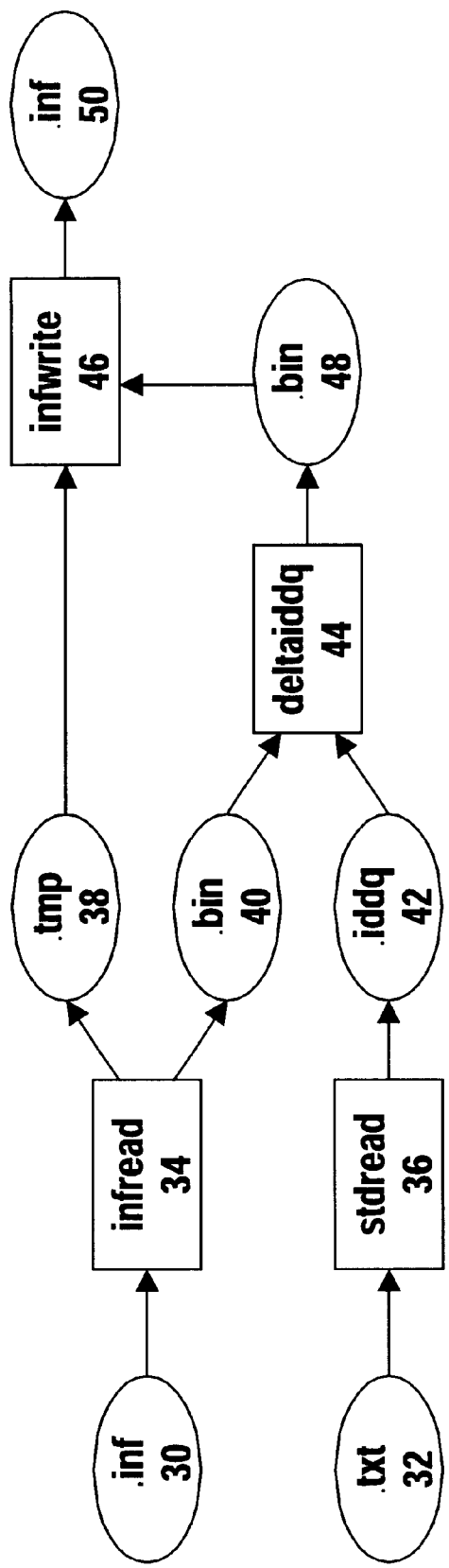
FIG. 3 is flow chart of a method for rebinning integrated circuits as passing or failing.

FIG. 3 is a flow chart of a more detailed embodiment of a computer program to accomplish the method of the present invention. The computer program is an instruction set residing on digital media for enabling a computing device to receive and analyze an ordered data set, as described below. The flowchart of FIG. 3 depicts the input and output files, designated as ellipses in FIG. 3, that are used and created by the different instruction set modules, designated as rectangles in FIG. 3. The collection of different instruction set modules is given the title of "delta-Iddq." The delta-Iddq bin analyzer program is a software tool, most preferably written in C++, whose purpose is to analyze $I_{ddq}$ data and determine binning of integrated circuits based on the maximum deltas seen between successive $I_{ddq}$ vectors. Other software routines can also be written to apply the principles of the invention to characteristics of the integrated circuits other than $I_{ddq}$. Therefore, the specific embodiment described below is representative of other programs that perform similar functions.

The delta-Iddq bin analyzer is preferably comprised of four modules. A module named "infread" 34 reads an .inf file 30 and extracts the bin data from the wafer tester 12 into a more useable .bin file 40, and a slightly modified .tmp file 38 that is used by a later module. A module named "stdread" 36 reads a .txt file 32 and extracts the $I_{ddq}$ data from the wafer tester 12 into a more useable .iddq file 42. The .inf file 30 and the .txt file 32 may be standard files that are created by a wafer tester 12 that operates in a traditional manner, with the exception that the wafer tester 12 preferably does not ink any of the integrated circuits that violate the predetermined expected limits programmed into the wafer tester 12. Alternately, the .inf file 30 and the .txt file 32 are produced by a wafer tester 12 that is not programmed with predetermined expected limits, and does not bin any of the integrated circuits that are tested. In this latter case, some of the procedures as described below are modified accordingly.

The core module "deltaiddq" 44 reads in the bin file 40 and .iddq file 42 generated by the infread module 34 and the stdread module 36 respectively, and outputs a modified .bin file 44 based on the $I_{ddq}$ data. A module named "infwrite" 46 reads in the .tmp file 38 and the .bin file 48 and overwrites the updated binning information in the .tmp file 38 in an .inf file 50. The format of the .inf file 50 is preferably the same as the format of the .inf file 30, so that the .inf file 50 can be subsequently used in the same manner that the precursor .inf file 30 would have been used, had the data not been further processed as described herein. The specific functions of these different software modules are described in more detail below.

The infread module 34 extracts the binning data, such as pass and failure codes, for the integrated circuits that have been tested on a wafer tester 12. This data is contained in the .inf file 30, and may be formatted according to a standard industry specification. The bin data is preferably extracted from the .inf file 30 into a format that is more easily readable by the deltaiddq module 44. This infread module 34 is preferably a separate software module from the deltaiddq module 44 so that if the .inf file 30 format changes, modifications will only be needed in the infread module 34. However, in other embodiments, all of the functions of the various routines as described herein are contained within a single software module.

The infread module 34 is invoked by issuing the command "infread <filename.inf>" where <filename.inf> is preferably a standard .inf file, as described above. The infread module 34 outputs the .bin file 40, which contains the iBinCodeLast bin data from the .inf file 30, and also outputs the .tmp file 38 that contains all of the data of the original .inf file 30, with iBinCodeLast data renamed to iBinCodePreIDDQ. Defined variables preferably include ROWS, which is the number of rows of bin data in the .inf file 30, and COLS, which is the number of columns of bin data in the .inf file 30.

In a most preferred embodiment, the infread module 34 works by scanning in the .inf file 30 and outputting the .tmp file 38 until the iBinCodeLast tag is identified. Instead of outputting the iBinCodeLast tag, the iBinCodePreIDDQ tag is output instead. Then the bin data is preferably read into a 2-dimensional array. Because later data replaces earlier data, if there are multiple sets of iBinCodeLast data, then the last data set in the .inf file 30 is preferably the final result that is output. Finally, the bin data is output to the .bin file 40 in transverse order (highest row and column first) to correspond to the format of the .inf file 30.

The stdread module 36 is used to extract the $I_{ddq}$ data from the .txt file 32 into a format that is more easily readable by the deltaiddq module 44. The stdread module 36 is preferably separate from the deltaiddq module 44 so that if the format of the .txt file 32 changes, modifications are only needed in the stdread module 36. However, as mentioned above, the various modules may alternately be incorporated into a single module. The stdread module 36 extracts the data for the tests with unique names that contain the string "IDDQ." In the case of multiple tests with the same name, only the first one is read in by the stdread module 36.

The stdread module 36 is invoked by issuing the command "stdread <filename.txt>," where <filename.txt> is a modified text-based .std file. The stdread module 36 outputs the .iddq file 42, which contains the $I_{ddq}$ data from the .txt file 32. The format of the .iddq file 42 is: X-coord, Y-coord, IDDQ1, IDDQ2, IDDQ3, . . . , IDDQN, where the data is written in a tab separated format.

Two passes are preferably made through the .txt file 32 by the stdread module 36. The first pass through the .txt file 32 reads in all of the data with the "TSR.test_num" tag (the test numbers) and then scans through them for the pattern "IDDQ." If this pattern is found, the part of the test name after "IDDQ" is compared with the previously accepted test names, and if it does not match any, then this test number is accepted as an $I_{ddq}$ test. The result of this scheme is that only the first of each test with the same name is read in. For example, if "PRE_IDDQ1" is read in first and "POST_IDDQ1" second, the "POST_IDDQ1" test is ignored. Any subsequent tests with the name "PRE_IDDQ1" are also ignored.

The second pass through the .txt file 32 scans for "PTR.test" tags. When the stdread module 36 finds a PTR.test tag, it reads in the test number and determines whether it represents an $I_{ddq}$ test, as determined by the first pass through. If it is $I_{ddq}$ test data, then the $I_{ddq}$ test data is stored in a temporary array. When a "PRR.x_coord" tag is encountered, the stdread module 36 knows that all the data has been read in for a particular integrated circuit location. The X-coordinate and Y-coordinate for that integrated circuit is read in, and then outputted to the .iddq file 42 along with the stored $I_{ddq}$ vector data for that location. The data in the .txt file 32 is typically stored in amps, but for the .iddq file 42, these values are preferably multiplied by one million to yield units of micro amps. If data is not present for a particular vector, a zero is inserted instead.

The deltaiddq module 44 is the core module for the delta $I_{ddq}$ analysis procedure. The deltaiddq module 44 takes in $I_{ddq}$ data and previously specified binning data, such as from the wafer tester 12, if any, and modifies the bin data based on a delta-$I_{ddq}$ analysis of the $I_{ddq}$ data. The deltaiddq module 44 is invoked by issuing the command "deltaiddq <filename.iddq> <filename.bin>," where <filename.iddq> is the .iddq file 42 output by the stdread module 36 and <filename.bin> is the .bin file 40 output by the infread module 34. The deltaiddq module 44 outputs the .bin file 48 containing modified binning data for the integrated circuits.

Defined variables include COLUMNS, which is the number of columns on the wafer, ROWS, which is the number of rows on the wafer, VECTORNUM, which is the number of $I_{ddq}$ vectors used during wafer testing, XSTART, which is the number of the first column of data, YSTART, which is the number of the first row of data, BINCOL, which is the number of columns of bin data in the .bin file 40, BINROW, which is the number of rows of bin data in the .bin file 40, ATHRESH, which is the threshold used for determining average delta $I_{ddq}$'s, DHTHRESH, which is the threshold for rebinning a bin category 1 (passing) to a bin category 9 (failing), and DLTHRESH, which is the threshold for rebinning a bin category 9 (failing) to a bin category 1 (passing).

The bin data is read in from the .bin file 40, and the $I_{ddq}$ data is read in from the .iddq file 42. Because the number of rows and columns between .bin file 40 and the .iddq file 42 may not match, the .bin file 40 is scanned to determine the first and last columns and rows which actually contain bin data. Next, the delta-Iddq values are calculated based on the data in the .iddq file 42. This is accomplished by subtracting the values of adjacent $I_{ddq}$ vectors. Next, the average delta between each vector is calculated, based on all integrated circuits that have all of their values below the ATHRESH parameter. Then these averages are subtracted off of the delta $I_{ddq}$ values. This is done to account for any inherent changes in $I_{ddq}$ values between vectors.

Then the bin-sort process is repeated according to the following methodology: If an integrated circuit was a bin 1, or in other words was assigned a passing code of 1, and has a maximum delta $I_{ddq}$ above DHTHRESH, then it is rebinned as a bin 9, or in other words is assigned a failure code. If the integrated circuit was a bin 9 and has a maximum delta $I_{ddq}$ below DLTHRESH, then it is rebinned as a bin 1. Finally, the bin data is output to the .bin file 48 in transpose order.

Thus, in the preferred embodiment, the threshold or offset value used to rebin a failing device as a passing device can be different from the threshold of offset value used to rebin a passing device as a failing device. In various embodiments, these offsets can be predetermined values, such as values based on empirical data, or they can be statistically determined from the current data set, such as a three sigma limit. Further, the reference value by which the deviation of the individual integrated circuits is measured may also be a predetermined value, such as determined by empirical data, or it can be a statistically determined value from the current data set, such as a mean, median, or mode average of the current data set.

The infwrite module 46 is used to insert the bin data from the .bin file 48 generated by the deltaiddq module 44 into the .tmp file 38 generated by the infreadmodule 34. The result is an .inf file 50, wherein the binning of the integrated circuits has been updated as explained above, based on the analysis of the $I_{ddq}$ data. The infwrite module 46 is preferably separate from the deltaiddq module 44 so that if the desired format of the .inf file 50 changes, modifications are only needed in the infwrite module 46. However, as mentioned above, all of the modules may be contained within a single module in an alternate embodiment.

The infwrite module 46 is invoked by issuing the command "infwrite <filename.tmp> <filename.bin,>" where <filename.tmp> is the .tmp file 38 output by the infread module 34, and <filename.bin> is the corresponding .bin file 48 output by the deltaiddq module 44. The infwrite module 46 outputs an .inf file 50 containing the original iBinCodeLast maps renamed to iBinCodePreIDDQ, along with the new iBinCodeLast map based on the modifications to the binning codes made by the deltaiddq module 42. Defined variables include ROWS, which is the number of rows of bin data in the .inf file 50, and COLS, which is the number of columns of bin data in the .inf file 50.

The bin data is read in as ordered in the .bin file 48. One pass is made through the .tmp file 38 to determine where to insert the new iBinCodeLast data, as there can be multiple iBinCodePreIDDQ sections. Then a second pass is made through the .tmp file 38, which outputs the .inf file 50 until the point is reached as determined in the first pass through. Then the new bin data from the .bin file 48 is preferably output to the .inf file 50 in a standard .inf file format, similar or identical to that of the original .inf file 30. The remainder of the .tmp file 38 is then output to the new .inf file 50.

Program code in C++ for a preferred embodiment of the deltaiddq module 44 described above is given below.

```cpp
#include <fstream.h>
#include <iostream.h>
#include <math.h>
#include <string.h>
#include <stdlib.h>
#define VECTORNUM  20   // number of iddq vectors
#define COLUMNS    26   // number of columns of data
#define ROWS       27   // number of rows of data
#define XSTART     49   // coordinate of first column
#define YSTART     38   // coordinate of first row
#define BINCOL     28   // number of cols in inf bin file
#define BINROW     28   // number of rows in inf bin file
#define ATHRESH    80   // threshold for determining average iddq
#define DHTHRESH   20   // maximum iddq tolerated for bin 1
#define DLTHRESH    5   // minimum iddq tolerated for bin 9
int main(int argc, char *argv[ ] )
{
    float iddq[VECTORNUM] [COLUMNS] [ROWS];    // iddq data [vector#] [x-value] [y-value]
        int bin[COLUMNS] [ROWS];               // bin data [x-value] [y-value]
        char tempbin[BINCOL] [BINROW] [3];     // temp storage for bin data read in
        int itempbin[BINCOL] [BINROW];         // integer storage of bins
        int athreshflag[COLUMNS] [ROWS];       // =1 if die is <= ATHRESH, 0 if not
        int deltaiddq[VECTORNUM] [COLUMNS] [ROWS];  // delta iddqs
        int maxdelta;                          // maximum delta for a die
        float avgdelta[VECTORNUM];             // average delta for each vector
        int deltacount[VECTORNUM];             // count of number of deltas
        int diddqbin[100];                     // bins for diddq values
        int i, j, k;                           // counters
        ifstream fin;                          // input stream for iddq data file
        ifstream fin2;                         // input stream for bin data file
        ofstream fout;                         // file output stream
        int x, y;                              // x, y values
        char ctemp = '[0]';                    // temp char
        char ofname[100];                      // string for output filename
        int colsum[BINCOL];                    // sum of col bins
        int rowsum[BINROW];                    // sum of row bins
        int firstrow;                          // index of first non-blank bin row
        int lastrow;                           // index of last non-blank bin row
        int firstcol;                          // index of first non-blank bin col
        int lastcol;                           // index of last non-blank bin col
    if (argc > 2)
    {
        fin.open(argv[1]);
        fin2.open(argv[2]);
    }
    else
    {
        cout << "*Error in deltaiddq: Input files not specified*\n";
        cout << "usage: deltaiddq <filename.iddq> <filename.bin>\n\n";
        return 1;
    }
    strcpy(ofname, argv[1]);
    while ((ofname[i] != '\0') && (ofname[i] != '.') && (i<100))
    {
        i++;
    }
    ofname[i] = '\0';
    strcat(ofname, ".bin");
    fout.open(ofname);
    // initialize array
    for (j=0; j<COLUMNS; j++)
    {
        for (k=0; k<ROWS; k++)
        {
            for (i=0; i<VECTORNUM; i++)
```

*-continued*

```cpp
            {
                iddq[i] [j] [k] = 0;
                deltaiddq[i] [j] [k] = 0;
            }
            bin[j] [k] = 0;
            athreshflag[j] [k] = 0;
        }
    }
    for (i=0; i<VECTORNUM; i++)
    {
        avgdelta[i] = 0;
        deltacount[i] = 0;
    }
    // input iddq data
    while (ctemp != EOF)
    {
        fin >> x;
        fin >> y;
        for (i=0; i<VECTORNUM; i++)
        {
            fin >> iddq[i] [x-XSTART] [y-YSTART];
            if (iddq[i] [x-XSTART] [y-YSTART] >= ATHRESH)
                athreshflag[x-XSTART] [y-YSTART] = 1;
        }
        ctemp = fin.get( );
    }
    // input bin data
    for (j=0; j<BINROW; j++)
    {
        rowsum[j] = 0;
        for (k=0; k<BINCOL; k++)
        {
            fin2 >> tempbin[k] [j];
            if ((strcmp(tempbin[k] [j], "_") != 0) && (strcmp(tempbin[k] [j], "@ @") != 0))
            {
                if (strcmp(tempbin[k] [j], "0A") == 0)
                    itempbin[k] [j] = 10;
                else if (strcmp(tempbin[k] [j], "0B") == 0)
                    itempbin[k] [j] = 11;
                else if (strcmp(tempbin[k] [j], "0C") == 0)
                    itempbin[k] [j] = 12;
                else if (strcmp(tempbin[k] [j], "0D") == 0)
                    itempbin[k] [j] = 13;
                else if (strcmp(tempbin[k] [j], "0E") == 0)
                    itempbin[k] [j] = 14;
                else if (strcmp(tempbin[k] [j], "0F") == 0)
                    itempbin[k] [j] = 15;
                else
                    itempbin[k] [j] = atoi(tempbin[k] [j]);
            }
            else
                itempbin[k] [j] = 0;
            rowsum[j] += itempbin[k] [j];
        }
    }
    // eliminate blank rows and columns on edges
    for (j=0; j<BINCOL; j++)
    {
        colsum[j] = 0;
        for (k=0; k<BINROW; k++)
        {
            colsum[j] += itempbin[j] [k];
        }
    }
    for (i=0; rowsum[i]==0; i++);
    firstrow = i;
    for (i=0; colsum[i]==0; i++);
    firstcol = i;
    for (i=BINROW-1; rowsum[i]==0; i--);
    lastrow = i;
    for (i=BINCOL-1; colsum[i]==0; i--);
    lastcol = i;
    // copy tempbin to bin
    for (j=firstrow; j<=lastrow; j++)
    {
        for (k=firstcol; k<=lastcol; k++)
        {
            bin[k] [j] = itempbin[k] [j];
```

-continued

```
        }
    }
}
// post-process delta iddq values
for (j=0; j<COLUMNS; j++)
{
    for (k=0; k<ROWS; k++)
    {
        for (i=0; i<VECTORNUM; i++)
        {
            if (i == 0)
            {
                if ((iddq[i] [j] [k] != 0) &&
                    (iddq[VECTORNUM-1] [j] [k] != 0))
                {
                    deltaiddq[i] [j] [k] = (iddq[i] [j] [k] -
iddq[VECTORNUM-1] [j ] [k]);
                    if (athreshflag[j] [k] == 0)
                    {
                        avgdelta[0] += deltaiddq[i] [j] [k];
                        deltacount[0] ++;
                    }
                }
            }
            else
                if ((iddq[i] [j] [k] != 0) &&
                    (iddq[i-1] [j] [k] != 0))
                {
                    deltaiddq[i] [j] [k] = (iddq[i] [j] [k] -
iddq[i-1] [j] [k]);
                    if (athreshflag[j] [k] == 0)
                    {
                        avgdelta[i] += deltaiddq[i] [j] [k];
                        deltacount [i]++;
                    }
                }
        }
    }
}
// calculate average delta values
for (i=0; i<VECTORNUM; i++)
{
    avgdelta[i] = avgdelta[i]/deltacount[i];
}
// modify delta iddqs for vector variations
for (j=0; j<COLUMNS; j++)
{
    for (k=0; k<ROWS; k++)
    {
        for (i=0; i<VECTORNUM; i++)
        {
            deltaiddq[i] [j] [k] = abs(deltaiddq[i] [j] [k] -
            avgdelta[i]);
        }
    }
}
// re-binsort based an delta iddq data
for (j=0; j<COLUMNS; j++)
{
    for (k=0; k<ROWS; k++)
    {
        maxdelta = 0;
        for (i=0; i<VECTORNUM; i++)
        {
            if (deltaiddq[i] [j] [k] > maxdelta)
                maxdelta = deltaiddq[i] [j] [k];
        }
        if ((bin[j] [k] == 1) &&
            (maxdelta > DHTHRESH))
        {
            bin[j] [k] = 9;
            strcpy(tempbin[j] [k], "09");
        }
        else if ((bin[j] [k] == 9) &&
            (maxdelta < DLTHRESH))
        {
            if (maxdelta != 0)
            {
                bin[j] [k] = 1;
```

-continued

```
                strcpy(tempbin[j] [k], "01#");
            }
        }
    }
}
// output new bin data
for (j=BINROW-1; j>=0; j--)
{
    for (k=BINCOL-1; k>=0; k--)
    {
        fout << tempbin[k] [j] >> ' ';
    }
    fout << endl;
}
fin.close( )
fin2.close( );
fout.close( );
}
```

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. In a method for testing integrated circuits, the improvement comprising:
   a. introducing a predetermined set of input vectors as test input into the integrated circuits,
   b. sensing output from the integrated circuits in response to the predetermined set of input vectors,
   c. recording the output from the integrated circuits in a wafer map, referenced by position designations,
   d. mathematically manipulating the recorded output of the integrated circuits,
   e. individually comparing the recorded output for each of the integrated circuits to the mathematically manipulated recorded output of the integrated circuits,
   f. identifying graded integrated circuits that have output that differs from the mathematically manipulated recorded output of the integrated circuits by more than a given amount, and
   g. assigning a classification to the graded integrated circuits.

2. The method of claim 1, further comprising the step of recording the classification for the graded integrated circuits in the wafer map, referenced by the position designations for the graded integrated circuits.

3. The method of claim 1, wherein steps a, b, and c are accomplished by a wafer tester and all other steps are accomplished by an off-line binner.

4. The method of claim 1, wherein the associated position designations further comprise row and column coordinates of the integrated circuits based on locations of the integrated circuits on a wafer.

5. The method of claim 1, wherein the given amount used to identify the graded integrated circuits further comprises a predetermined value.

6. The method of claim 1, wherein the given amount used to identify the graded integrated circuits further comprises a value based on a degree of variation within the recorded output for the integrated circuits.

7. The method of claim 1, wherein the given amount used to identify the graded integrated circuits further comprises a value based on the standard deviation of the recorded output for the integrated circuits.

8. In a method for testing integrated circuits, the improvement comprising:
   a. introducing a predetermined set of input vectors as test input into the integrated circuits,
   b. sensing output from the integrated circuits in response to the predetermined set of input vectors,
   c. recording the output from the integrated circuits in a wafer map, referenced by position designations,
   d. individually comparing the recorded output for each of the integrated circuits to a predetermined expected output value,
   e. assigning a classification to the integrated circuits that violate the predetermined expected output value,
   f. recording the failure classification in the wafer map for the integrated circuits that violate the predetermined expected output value, referenced by position designations,
   g. mathematically manipulating the recorded output for the integrated circuits,
   h. individually comparing the recorded output for each of the integrated circuits to the mathematically manipulated recorded output for the integrated circuits,
   i. identifying graded integrated circuits that have output that differs from the mathematically manipulated recorded output for the integrated circuits by more than a given amount,
   j. assigning an adjusted classification to the graded integrated circuits, and
   k. correcting the recorded classifications to agree with the adjusted classifications.

9. The method of claim 8, wherein steps a through f are accomplished by a wafer tester and all other steps are accomplished by an off-line binner.

10. The method of claim 8, wherein the associated position designations further comprise row and column coordinates of the integrated circuits based on locations of the integrated circuits on a wafer.

11. The method of claim 8, wherein the mathematically manipulated recorded output for the integrated circuits further comprises an average of the recorded output for the integrated circuits.

12. The method of claim 8, wherein the given amount used to identify the graded integrated circuits further comprises a predetermined value.

13. The method of claim 8, wherein the given amount used to identify the graded integrated circuits further comprises a value based on a degree of variation within the recorded output for the integrated circuits.

14. An instruction set residing on a digital recording media, the instruction set for enabling a computing device to receive and analyze an ordered data set containing individual data points from a wafer tester relating to electrical characteristics of integrated circuits, and for enabling the computing device to associate codes with selected ones of the integrated circuits, the instruction set comprising:
   input instructions for receiving the ordered set of data from the wafer tester,
   computational instructions for mathematically manipulating the ordered set of data to produce a reference value,
   comparison instructions for comparing the individual data points to the reference value to identify individual data points that differ from the reference value by more than a given amount,
   binning instructions for associating the codes with the integrated circuits that have individual data points that differ from the reference value by more than the given amount, and
   output instructions for outputting the codes with the ordered data set.

15. The instruction set of claim 14, wherein the given amount used to associate the codes with the integrated circuits further comprises a predetermined value.

16. The instruction set of claim 14, wherein the given amount used to associate the codes with the integrated circuits further comprises a value based on a degree of variation within the individual data points.

17. The instruction set of claim 14, wherein the given amount used to associate the codes with the integrated circuits further comprises a value based on the standard deviation of the individual data points.

18. The instruction set of claim 14, wherein the reference value used to associate the codes with the integrated circuits further comprises a value based on an average of the individual data points.

19. The instruction set of claim 14, wherein the code segments for receiving the ordered set of data from the wafer tester further comprise code segments for receiving the ordered set of data from the wafer tester across a network connection.

20. The instruction set of claim 14, wherein the code segments for receiving the ordered set of data from the wafer tester further comprise code segments for reading the ordered set of data from the wafer tester from a digital magnetic media.

* * * * *